(12) United States Patent
Yang et al.

(10) Patent No.: US 8,324,080 B2
(45) Date of Patent: Dec. 4, 2012

(54) SEMICONDUCTOR DEVICE AND METHOD FOR INCREASING SEMICONDUCTOR DEVICE EFFECTIVE OPERATION AREA

(75) Inventors: Chang-Shiang Yang, Taoyuan (TW); Ke-Hsuan Liu, Taoyuan (TW)

(73) Assignee: Sun Well Solar Corporation, Taoyuan (TW)

( * ) Notice: Subject to any disclaimer, the term of this patent is extended or adjusted under 35 U.S.C. 154(b) by 0 days.

(21) Appl. No.: 13/223,280

(22) Filed: Aug. 31, 2011

(65) Prior Publication Data

US 2012/0056310 A1 Mar. 8, 2012

(30) Foreign Application Priority Data

Sep. 6, 2010 (TW) ................................ 99130004 A

(51) Int. Cl.
*H01L 21/30* (2006.01)
*H01L 21/46* (2006.01)
(52) U.S. Cl. ..................... 438/458; 438/462; 257/620
(58) Field of Classification Search .................. 438/458, 438/462; 257/620, E21.347, E23.179
See application file for complete search history.

(56) References Cited

U.S. PATENT DOCUMENTS 4,981,525 A * 1/1991 Kiyama et al. ............... 136/244
7,592,252 B2 * 9/2009 Tian et al. ..................... 438/637

FOREIGN PATENT DOCUMENTS

CN 101567303 B 7/2011
TW 510051 11/2002

* cited by examiner

*Primary Examiner* — Theresa T Doan
(74) *Attorney, Agent, or Firm* — Chun-Ming Shih; HDLS IPR Services

(57) ABSTRACT

A method for increasing semiconductor device effective operation area, comprising following steps: depositing first conductive layer on the substrate; using laser for scribing a plurality of the first scribe lines on the first conductive layer, where the scribe lines are scribed on the bottom of the first conductive layer; depositing a plurality of the semiconductor material layers on the first conductive layer and in the plurality of the first scribe lines; using laser for scribing a plurality of the second scribe lines on the semiconductor material layer, where the scribe lines are scribed on the bottom of the semiconductor material layer, each second scribe line is comprised of a plurality of the second pores; depositing a second conductive layer on the semiconductor material layer and in the plurality of the first scribe lines and the plurality of the second scribe lines; using laser for scribing a plurality of the third scribe lines on the second conductive layer, where the scribe lines are scribed on the bottom of the semiconductor material layer; wherein the second pores are shortened for shortening the distance between the first scribe line and second scribe line and the distance between the third scribe line and second scribe line.

9 Claims, 5 Drawing Sheets

SEMICONDUCTOR DEVICE AND METHOD FOR INCREASING SEMICONDUCTOR DEVICE EFFECTIVE OPERATION AREA

BACKGROUND OF THE INVENTION

1. Field of the Invention

The present invention relates to a method for increasing semiconductor device effective operation area.

2. Description of Prior Art

Among methods for manufacturing semiconductor devices, for example, the method for manufacturing thin film solar cell includes depositing a plurality of film layers to form thin film of optoelectronic components on the substrate. The thin film optoelectronic components comprise a first conductive layer, a plurality of thin film layers made by semiconductor materials and a second conductive layer for absorbing and transform optical energy into electrical energy. Multiple laser scribing processes are performed to form a plurality of cell modules in series. For the purpose to maximize the power generated by the semiconductor device effective operation area, it is critical to minimize the area made by the laser scribing which does not contribute to generate power. As a result, when perform laser scribing, it is important to keep each scribe line as close to each other as possible. However, an appropriate miss distance between scribe lines is also necessary so as to avoid issues such as scribe lines may overlap with each other or leakage currents may occur.

TW Pat. Certification No. 167815 "Partially Transparent Photovoltaic Modules" disclosed a method using laser scribing for removing at least part of the back electrode in a solar cell for making a partially transparent photovoltaic module, wherein the width of each scribe line is about 0.01 to 0.5 mm, and the distance between scribe lines is about 0.5 to 5 mm.

The CN Pat. Publication No. CN101567303 "Laser film engraving equipment, scribing method and amorphous silicon film photovoltaic panel manufactured by the same" disclosed a laser film engraving equipment and a scribing method for manufacturing amorphous silicon film photovoltaic panel in order to minimize the area made by the laser scribing which does not contribute to generate power.

Consequently, the objectives of the present invention are: first, shortening pore dimensions and enlarging the distance between neighboring pores of the same scribe line in order to improve manufacturing cost and time efficiency; and second shortening the horizontal distances between scribe lines in order to increase the semiconductor device effective operation area and at the same time keep an appreciate miss distance.

SUMMARY OF THE INVENTION

The present invention provides a method for increasing semiconductor device effective operation area. The method comprises following steps: depositing first conductive layer on the substrate; using laser for scribing a plurality of the first scribe lines on the first conductive layer, the plurality of the first scribe lines are scribed on the bottom of the first conductive layer, whereby part of the first conductive layer is removed and the substrate damage is minimized. Each first scribe line is comprised of a plurality of the first pores and ach first pore partially overlaps with the neighboring first pore. Next step is depositing a plurality of the semiconductor material layers on the first conductive layer and in the plurality of the first scribe lines. Then use laser for scribing a plurality of the second scribe lines on the semiconductor material layer, where the plurality of the second scribe lines is scribed on the bottom of the semiconductor material layer whereby part of the semiconductor material layer is removed and the first conductive layer damage is minimized. Each second scribe line is comprised of a plurality of the second pores. Then, deposit a second conductive layer on the semiconductor material layer and in the plurality of the first scribe lines and the plurality of the second scribe lines. Then, use laser for scribing a plurality of the third scribe lines on the second conductive layer. The plurality of the third scribe lines is scribed on the bottom of the semiconductor material layer whereby part of the semiconductor material layer is removed and part of the second conductive layer is removed and the first conductive layer damage is minimized. Each third scribe line is comprised of a plurality of the third pores and each third pore partially overlaps with the neighboring third pore. The second pores are shortened for shortening the distance between the first scribe line and second scribe line and the distance between the third scribe line and second scribe line whereby increasing semiconductor device effective operation area.

According to an embodiment of the present invention According to an embodiment of the present invention, each second pore partially overlaps with the neighboring second pore.

According to an embodiment of the present invention, each second pore is distant from the neighboring second pore.

According to an embodiment of the present invention, the shortest distance between the central point of each second pore and the central point of the neighboring second pore is at least 20 μm.

According to an embodiment of the present invention, the shortest distance between the central point of each second pore and the pore boundary is less than 20 μm.

According to an embodiment of the present invention, the shortest distance between the central point of each first pore and the pore boundary is 5 to 20 μm.

According to an embodiment of the present invention, the shortest distance between the central point of each third pore and the pore boundary is 15 to 40 μm.

According to an embodiment of the present invention, the distance between the first scribe line and second scribe line and/or the distance between the third scribe line and second scribe line is less than 80 μm.

According to an embodiment of the present invention, the conductivity of the circuit channels formed by the second pores must be at least 50S, the first conductive layers contact with the second conductive layers via circuit channels.

The present invention provides a semiconductor device, where an effective operation area increases. The semiconductor device comprises a substrate; a first conductive layer formed on the substrate and scribed by laser. The laser scribing being scribed on the bottom of the first conductive layer whereby part of the first conductive layer is removed and the substrate damage is minimized to form a plurality of the first scribe lines. Each first scribe line is comprised of a plurality of the first pores, and each first pore partially overlaps with the neighboring first pore. The device also includes a plurality of the semiconductor material layers formed on the first conductive layer and scribed by laser. The laser scribing are scribed on the bottom of the semiconductor material layer whereby part of the semiconductor material layer is removed and the first conductive layer damage is minimized to form a plurality of the second scribe lines. Each second scribe line is comprised of a plurality of the second pores. The device also includes a second conductive layer formed by laser scribing on the semiconductor material layer. The laser scribing is scribed on the bottom of the semiconductor material layer whereby part of the semiconductor material layer is removed and part of the second conductive layer is removed and the first conductive layer damage is minimized to form a plurality of the third scribe lines. Each third scribe line is comprised of a plurality of the third pores, and each third pore partially overlaps with the neighboring third pore. The second pores are shortened for shortening the distance between the first scribe line and second scribe line and the distance between the third scribe line and second scribe line whereby increases the semiconductor device effective operation area.

According to an embodiment of the present invention, each second pore partially overlaps with the neighboring second pore.

According to an embodiment of the present invention, each second pore is distant from the neighboring second pore.

According to an embodiment of the present invention, the shortest distance between the central point of each second pore and the central point of the neighboring second pore is at least 20 μm.

According to an embodiment of the present invention, the shortest distance between the central point of each second pore and the pore boundary is less than 20 μm.

According to an embodiment of the present invention, the shortest distance between the central point of each first pore and the pore boundary is 5 to 20 μm.

According to an embodiment of the present invention, the shortest distance between the central point of each third pore and the pore boundary is 15 to 40 μm. According to an embodiment of the present invention, the distance between the first scribe line and second scribe line and/or the distance between the third scribe line and second scribe line is less than 80 μm.

According to an embodiment of the present invention, the conductivity of the circuit channels formed by the second pores must be at least 50S, the first conductive layers contact with the second conductive layers via circuit channels.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

In cooperation with attached drawings, the technical contents and detailed description of the present invention are described thereinafter according to preferred embodiments, being not used to limit its executing scope. Any equivalent variation and modification made according to appended claims is all covered by the claims claimed by the present invention.

The present invention relates to improving a semiconductor device effective operation area. The following embodiment uses an example of a thin film solar cell module.

Figure 1A:
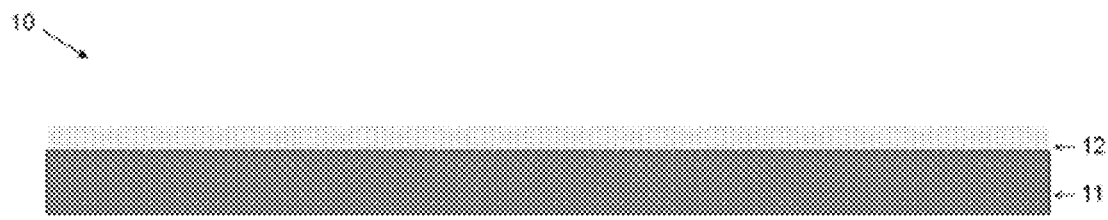
FIG. 1A to FIG. 1F are cross-section views illustrating a method for forming a thin film solar cell module 10 via laser scribing.
Figure 1B:
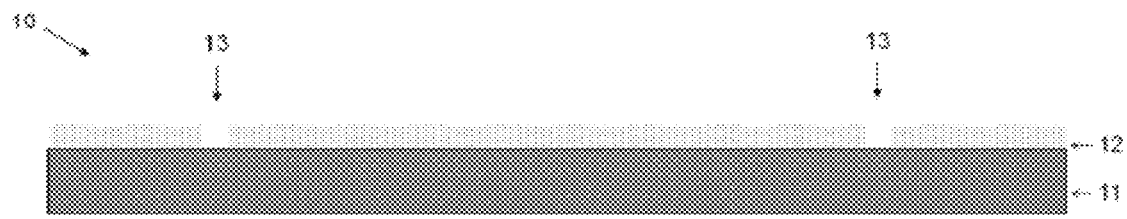
Figure 1C:
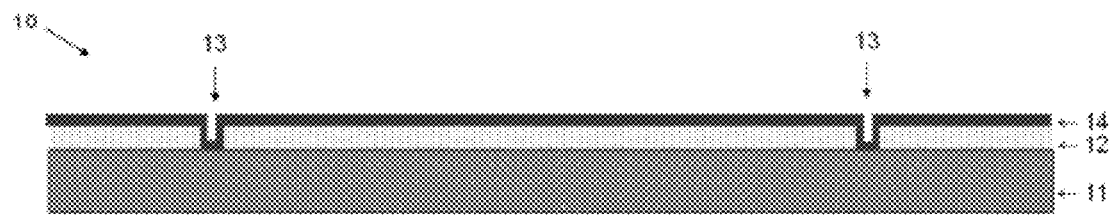
Figure 1D:
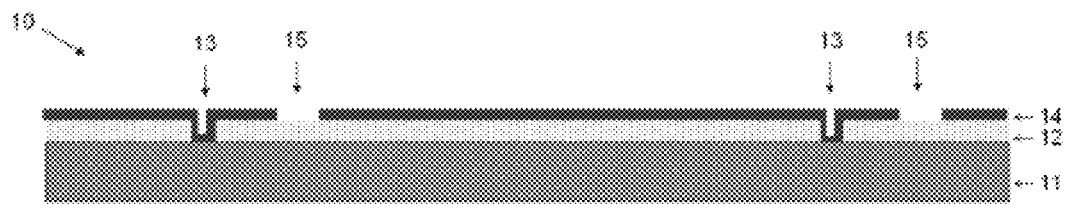
Figure 1E:
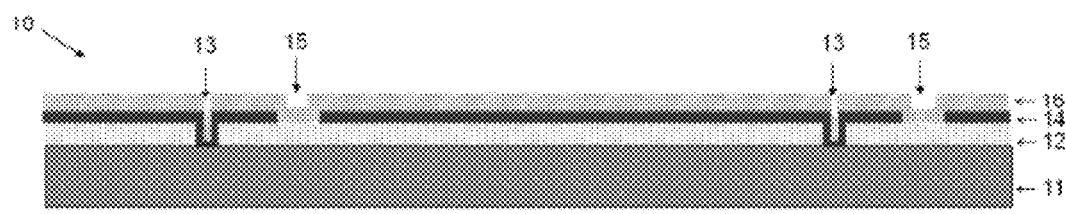
Figure 1F:
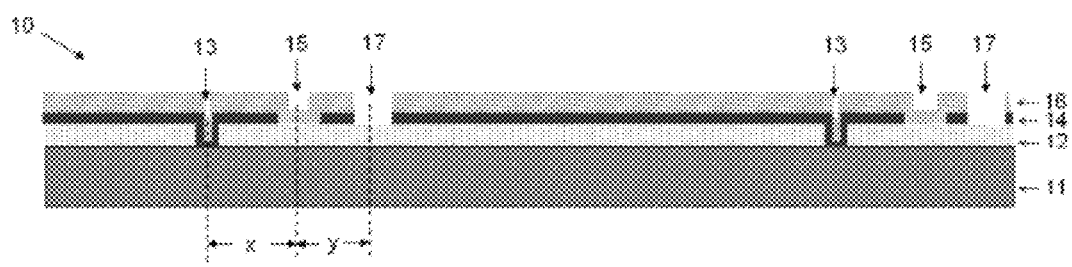

FIG. 1A to FIG. 1F are cross-section views illustrating a method for forming a thin film solar cell module 10 via laser scribing. In FIG. 1A, a depositing first conductive layer 12 is on a substrate 11. In FIG. 1B, laser is used for scribing a plurality of the first scribe lines 13 on the first conductive layer 12, wherein the plurality of the first scribe lines 13 are scribed on the bottom of the first conductive layer 12 to form a plurality of separated first conductive layers 12. Each scribe line in the plurality of the first scribe lines 13 is substantially parallel to each other. In FIG. 1C, a plurality of the semiconductor material layers 14 are deposited on the first conductive layer 12 and in the plurality of the first scribe lines 13. In FIG. 1D, laser is used for scribing a plurality of the second scribe lines 15 on the semiconductor material layers 14, wherein a plurality of the second scribe lines 15 are scribed on the bottom of the semiconductor material layer 14 to form a plurality of separated semiconductor material layers 14. Each scribe line of the plurality of the second scribe lines 15 is substantially parallel to each other. The second scribe lines 15 are substantially parallel with the first scribe lines 13. In FIG. 1E, a second conductive layer 16 is deposited on the semiconductor material layer 14, on the plurality of the first scribe lines 13 and in the plurality of the second scribe lines 15. The second conductive layer 16 of the cell unit contacts with the first conductive layer 12 of the neighboring cell unit to form circuit channels to connect neighboring cell in series. In FIG. 1F, laser is used for scribing a plurality of the third scribe lines 17 in the second conductive layer 16, wherein a plurality of the third scribe lines 17 are scribed to the bottom of the semiconductor material layer 14 to form the plurality of separated second conductive layer 16. Each scribe line of a plurality of the third scribe lines 17 is substantially parallel to each other. The third scribe lines 17 is substantially parallel with the first scribe lines 13 and second scribe lines 15.

Figure 2A:
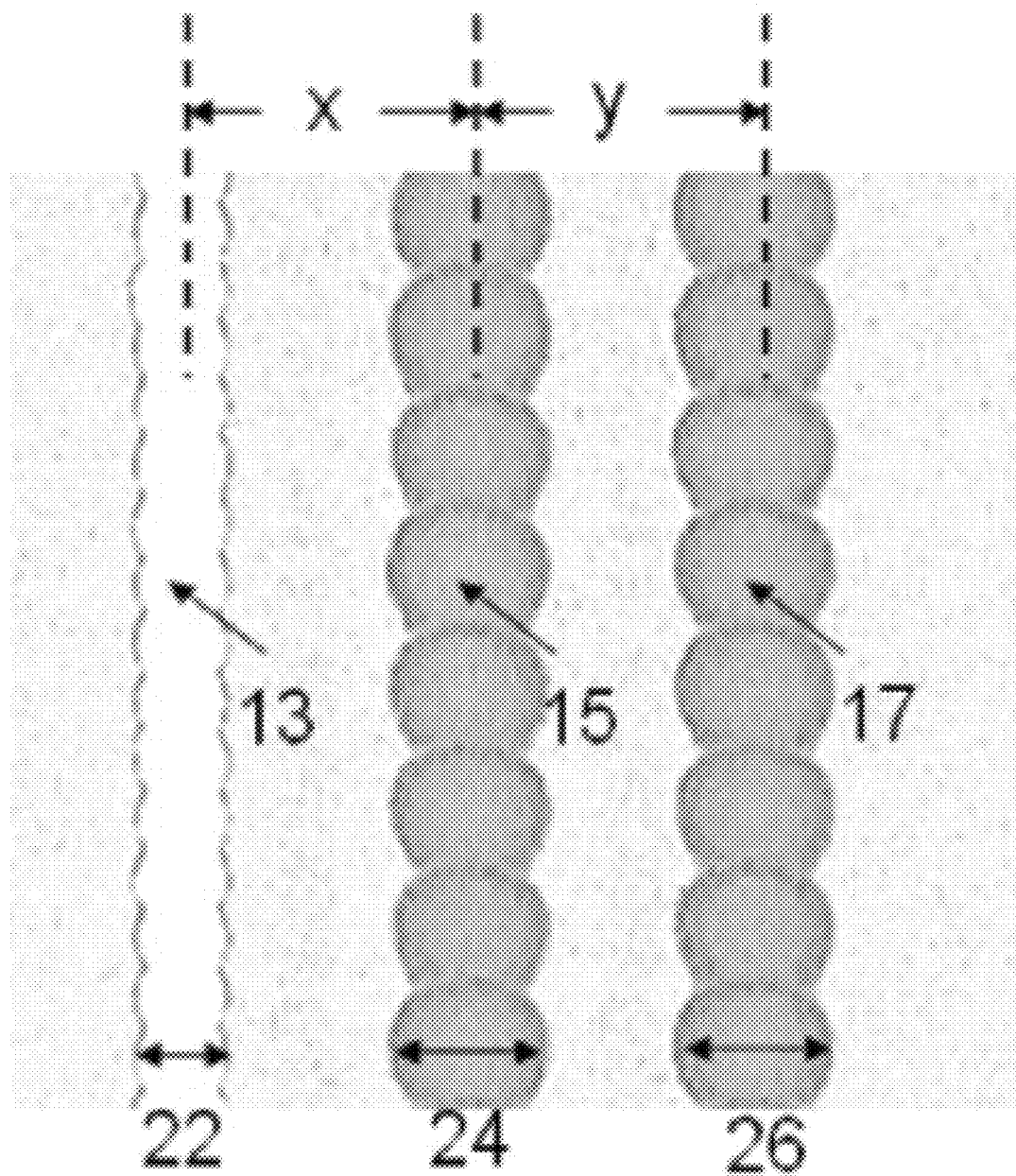
FIG. 2A to FIG. 2C are plan views illustrating the first scribe lines 13, the second scribe lines 15 and the third scribe lines 17 scribed by laser.

The method of laser scribing uses laser beam spots of specific dimensions for removing materials on specific positions to form continuous pores, wherein parts of the pores overlap with each other and form scribe lines. FIG. 2A is a plan view illustrating the first scribe lines 13, the second scribe lines 15 and the third scribe lines 17 scribed by laser. In FIG. 2A, each first scribe line 13 is comprised of a plurality of the first pores 22. Each second scribe line 15 is comprised of a plurality of the second pores 24. Each third scribe line 17 is comprised of a plurality of the third pores 26. The horizontal median distance x between the first scribe lines 13 and the second scribe lines 15 and the horizontal median distance y between the third scribe lines 17 and the second scribe lines 15 is about 100 μm. It should be noted that: term "median distance" refers to the distance between a central line of a scribe line and a central line of another scribe line, where two central lines parallel with each other.

When performing laser scribing, the first scribe lines 13, the second scribe lines 15 and the third scribe lines 17 must keep each other as close to each other as possible. Due to the offset of the first scribe lines 13, the second scribe lines 15 and the third scribe lines 17 generated by factors such as temperature during laser scribing, laser beam points may not arrive on target positions precisely. Accordingly, appropriate miss distances between the first scribe lines 13, the second scribe lines 15, and the third scribe lines 17 have to be reserved for avoid scribe lines overlapping and generating leakage currents or shorts. However, it is difficult to shorten the horizontal distances between the first scribe lines 13, the second scribe lines 15 and the third scribe lines 17 and reserve appropriate miss distance at the same time.

Accordingly, the method of the present invention uses the above mentioned laser scribing to form the thin film solar cell modules in series (as shown in FIG. 1A to FIG. 1F) via out of focus technique and/or lowering laser power in order to shorten laser beam spot dimensions and shorten the second pores in the step using laser for scribing a plurality of the second scribe lines on the semiconductor material layers 15. It should be noted that because the laser power is lowered, the laser life time is increased and manufacturing cost efficiency is improved.

Figure 2B:
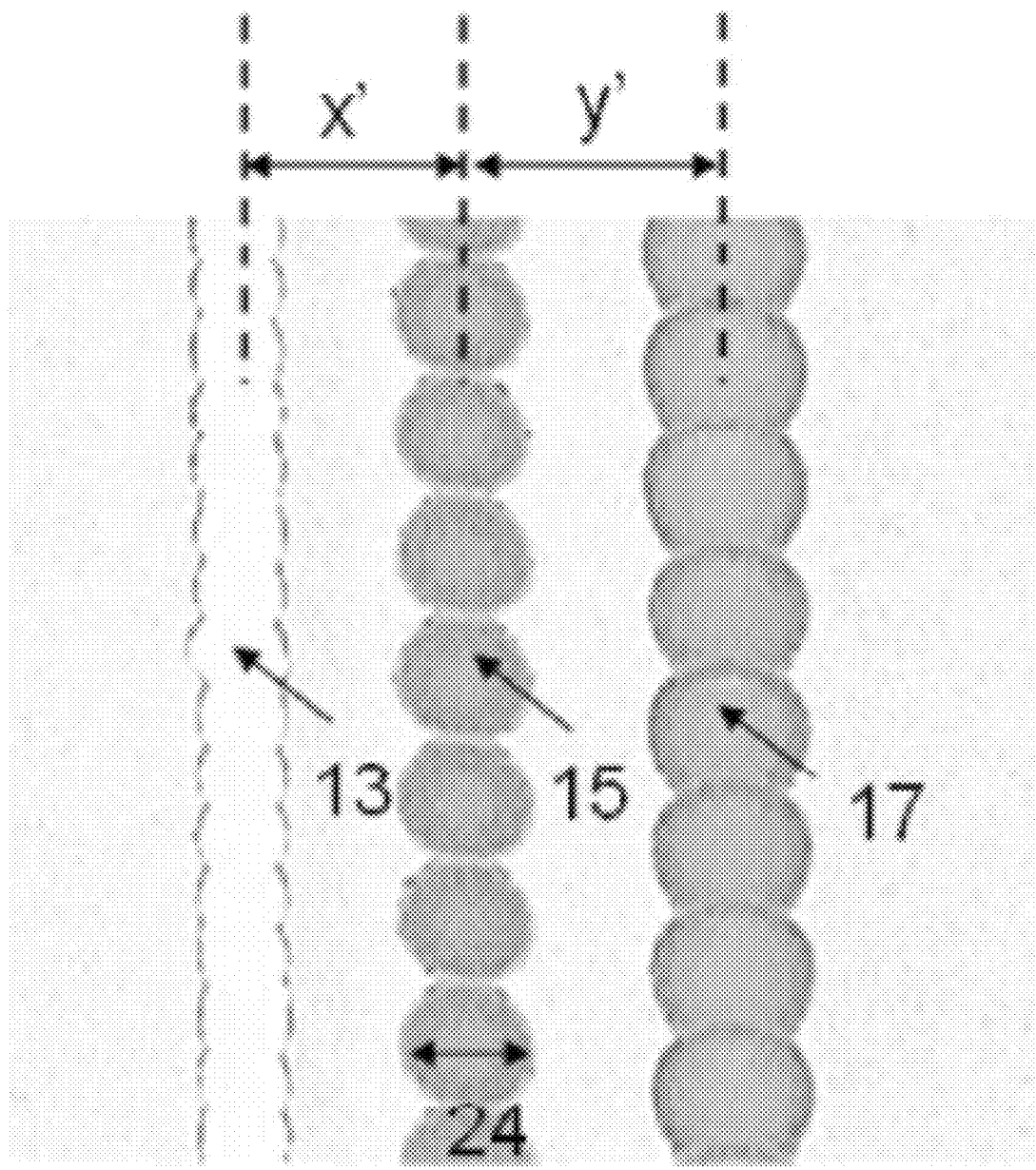
Figure 2C:
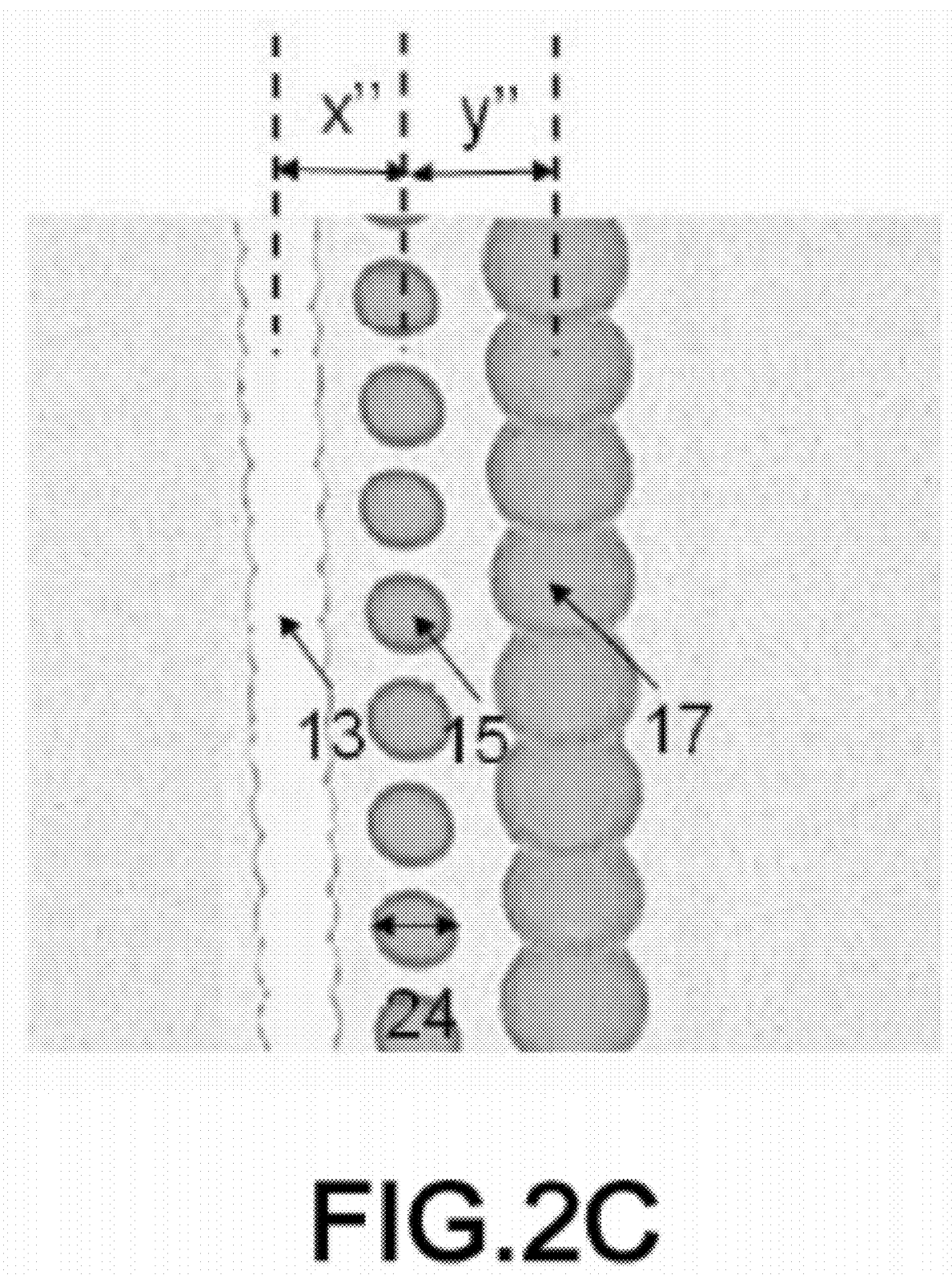

FIG. 2A to FIG. 2C are plan views illustrating the first scribe lines 13, the second scribe lines 15 and the third scribe lines 17 scribed by laser. In FIG. 2B and FIG. 2C, the radius of the second pores 24 is shortened to less than 20 μm, and the radius of the first pores is kept at 5 to 20 μm, the radius of the third pores is kept at 15 to 40 μm. Compare to FIG. 2A, the second pores 24 are shortened, the first pores 22 and the third pores 26 are kept on the same sizes. Though the first pores 22, the second pores 24 and the third pores 26 are circular pores according to the above embodiments, the invention is not limited thereto. The first pores 22, the second pores 24 and the third pores 26 may be pores of various shapes, for example, shapes of a square, a triangle, an ellipse.

In an embodiment as shown in FIG. 2B, the horizontal median distance x' between the first scribe lines 13 and second scribe lines 15 and the horizontal median distance y' between the third scribe lines 17 and second scribe lines 15 can be reduced to be less than 80 μm, yet an appropriate miss distance is reserved. In a more preferred embodiment as shown in FIG. 2C, horizontal median distance x" between the first scribe lines 13 and second scribe lines 15 and the horizontal median distance y" between the third scribe lines 17 and second scribe lines 15 can be reduced to be less than 50 μm, yet an appropriate miss distance is reserved. Because the horizontal median distance x', x" between the first scribe lines 13 and second scribe lines 15 and the horizontal median distance y', y" between the third scribe lines 17 and second scribe lines 15 are reduced, the area for generating power in a solar cell module increases.

In the steps of generating the plurality of the second scribe lines 15 by using laser scribing, each second pore 24 can partially overlap with neighboring second pores 24, that is, the plurality of the second scribe lines 15 are through scribe lines as shown in FIG. 2B. Each second pore 24 may also not overlap with neighboring second pores 24, that is, the plurality of the second scribe lines 15 are formed by the plurality of the second pores 24 not connected to each other. The shortest distance between the central point of each second pore 24 and the central point of the neighboring second pores 24 can be at least 20 μm as shown in FIG. 2C. Though shortening the second pores 24, changing frequency of laser pulse shooting and/or changing moving speed of laser beam or substrate platform of the loading machine may cause that each second pore 24 do not overlap with neighboring second pores 24, the conductivity between components and components on the first conductive layers and the second conductive layers is not significantly impacted. This is because that an appropriate contact area between a first conductive layer 12 and a second conductive layer 16 and an appropriate thickness of a semiconductor material layer 14 are kept. The conductivity of the circuit channel formed by the second pores 24 (which allow a first conductive layer contacts with a second conductive layer) is in proportion to the cross section area of the second pores 24 and is in inverse proportion to the thickness of a semiconductor material layer 14 (that is the length of the circuit channel). According to an embodiment of the present invention, for example, when the resistance of a first conductive layer 12 and a second conductive layer 16 (the conductive layer used is ZnO:B) is $1.9 \times 10-3 \Omega$-cm, the thickness of a semiconductor material layer is 250 nm, and the cross section area of a second pores 24 (the radius is 20 μm) is 1256 μm2, then the conductivity is 270.2S, yet the present invention is not limited by the above embodiment. According to the present invention, it is also possible to change the materials or the thickness of a first conductive layer 12 and a second conductive layer 16, the thickness of a semiconductor material layer 14 or the dimensions of a second pores 24. It should be noted that: the conductivity of circuit channels formed by the second pores 24 must be at least 50S to assure the conductive property is not impacted. At the same time, because each second pore 24 may not overlap with neighboring second pore 24 and separated from each other, the amount of the second pores 24 is lowered which means the laser scribing speed increases and the manufacturing speed is improved.

It should be noted that: though the second pores 24 are shortened so as to reduce the horizontal median distances x', x" between the first scribe lines 13 and the second scribe lines 15 and the horizontal median distance y', y" between the third scribe lines 17 and the second scribe lines 15, the horizontal median distance x', x" between the first scribe lines 13 and the second scribe lines 15 and the horizontal median distance y', y" between the third scribe lines 17 and the second scribe lines 15 cannot be reduced by shortening the first pores 22 or the third pores 26. Because shortening the shorten first pores 22 and the third pores 26 may cause that the pores do not overlap with each other and creates an impact on insulative property of the plurality of separated first conductive layers 12 and the plurality of separated second conductive layer 16.

In the above embodiments of the present invention, the substrate 11 can be made by glass, metal, ceramic or plastic materials. The first conductive layers 12 or the second conductive layers 16 can be transparent conductive films made by zinc oxide, indium tin oxides, tin oxides or metal films made by silver, aluminum, gold, copper, molybdenum, titanium. the semiconductor material layer 14 can be amorphous silicon thin films, nano-crystalline silicon thin films, microcrystalline silicon thin films, polycrystalline silicon thin films, copper indium diselenide thin films, copper indium gallium diselenide thin films, copper indium gallium sulfur selenide thin films, cadmium sulfide thin film,) aluminium gallium nitride thin films, gallium aluminum arsenide thin films, gallium nitride thin films, indium phosphide or gallium indium phosphide thin films, or a combination of the above mentioned materials.

The embodiments of the present invention uses silicon thin film solar cell module as an example. The present invention is not limited thereto. The method of the present invention can also used for laser scribing in other applications in semiconductors and optoelectronics.

As the skilled person will appreciate, various changes and modifications can be made to the described embodiments. It is intended to include all such variations, modifications and equivalents which fall within the scope of the invention, as defined in the accompanying claims.

What is claimed is:

1. A method for increasing semiconductor device effective operation area, comprising following steps:

depositing first conductive layer on the substrate;

using laser for scribing a plurality of the first scribe lines on the first conductive layer, the plurality of the first scribe lines being scribed on the bottom of the first conductive layer whereby part of the first conductive layer is removed and the substrate damage is minimized, each first scribe line being comprised of a plurality of the first pores, each first pore partially overlapping with the neighboring first pore;

depositing a plurality of the semiconductor material layers on the first conductive layer and in the plurality of the first scribe lines;

using laser for scribing a plurality of the second scribe lines on the semiconductor material layer, the plurality of the second scribe lines is scribed on the bottom of the semiconductor material layer whereby part of the semiconductor material layer is removed and the first conductive layer damage is minimized, each second scribe line being comprised of the plurality of the second pores;

depositing a second conductive layer on the semiconductor material layer and in the plurality of the first scribe lines and the plurality of the second scribe lines;

using laser for scribing a plurality of the third scribe lines on the second conductive layer, the plurality of the third scribe lines is scribed on the bottom of the semiconductor material layer, whereby part of the semiconductor material layer is removed and part of the second conductive layer is removed and the first conductive layer damage is minimized, each third scribe line is comprised of a plurality of the third pores, each third pore partially overlapping with the neighboring third pore;

wherein the second pores are shortened for shortening the distance between the first scribe line and second scribe line and the distance between the third scribe line and second scribe line, whereby increasing semiconductor device effective operation area.

2. The method of claim 1, wherein each second pore partially overlaps with the neighboring second pore.

3. The method of claim 1, wherein each second pore is distant from the neighboring second pore.

4. The method of claim 3, wherein a shortest distance between the central point of each second pore and the central point of the neighboring second pore is at least 20 μm.

5. The method of claim 1, wherein a shortest distance between the central point of each second pore and the pore boundary is less than 20 μm.

6. The method of claim 1, wherein a shortest distance between the central point of each first pore and the pore boundary is 5 to 20 μm.

7. The method of claim 1, wherein a shortest distance between the central point of each third pore and the pore boundary is 15 to 40 μm.

8. The method of claim 1, wherein a distance between the first scribe line and second scribe line and/or a distance between the third scribe line and second scribe line is less than 80 μm.

9. The method of claim 1, wherein the conductivity of the circuit channels formed by the second pores is at least 50S, and the first conductive layers contact with the second conductive layers via circuit channels.

* * * * *